US012796192B2

(12) United States Patent
Zhao et al.

(10) Patent No.: US 12,796,192 B2
(45) Date of Patent: Nov. 10, 2026

(54) ARRAY SUBSTRATE, BACKLIGHT MODULE AND DISPLAY PANEL

(71) Applicant: TCL China Star Optoelectronics Technology Co., Ltd., Shenzhen (CN)

(72) Inventors: Bin Zhao, Shenzhen (CN); Yan Li, Shenzhen (CN); Juncheng Xiao, Shenzhen (CN); Ji Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 601 days.

(21) Appl. No.: 17/289,301

(22) PCT Filed: Mar. 30, 2021

(86) PCT No.: PCT/CN2021/083842

§ 371 (c)(1),
(2) Date: Oct. 19, 2023

(87) PCT Pub. No.: WO2022/170672

PCT Pub. Date: Aug. 18, 2022

(65) Prior Publication Data

US 2024/0038946 A1 Feb. 1, 2024

(30) Foreign Application Priority Data

Feb. 10, 2021 (CN) ......................... 202110185649.5

(51) Int. Cl.
*H10H 20/857* (2025.01)
*H10H 29/20* (2026.01)
(Continued)

(52) U.S. Cl.
CPC .......... *H10H 20/857* (2025.01); *H10H 29/20* (2025.01); *H10H 29/24* (2025.01);
(Continued)

(58) Field of Classification Search
CPC ... H10W 90/00; H10W 90/10; H10W 90/701; H10W 90/792; H10H 29/00;
(Continued)

(56) References Cited

U.S. PATENT DOCUMENTS

| | | | | |
|---|---|---|---|---|
| 12,520,641 | B2 * | 1/2026 | Tian | G02F 1/133612 |
| 2002/0096254 | A1 | 7/2002 | Kober et al. | |

(Continued)

FOREIGN PATENT DOCUMENTS

| | | | |
|---|---|---|---|
| CN | 204348296 | U | 5/2015 |
| CN | 104979326 | A | 10/2015 |

(Continued)

OTHER PUBLICATIONS

International Search Report in International application No. PCT/CN2021/083842,mailed on Nov. 11, 2021.

(Continued)

*Primary Examiner* — Matthew E Warren
(74) *Attorney, Agent, or Firm* — Nathan & Associates Patent Agents Ltd.; Menachem Nathan

(57) ABSTRACT

The present invention provides an array substrate, a backlight module, and a display panel, by locating two second conductive pads connected to a second wire on the same side of a first wire, the present invention prevents an overlap between the first wire and the second wire connected to the two second conductive pad.

20 Claims, 18 Drawing Sheets

(51) Int. Cl.

| | |
|---|---|
| ***H10H 29/24*** | (2026.01) |
| ***H10H 29/39*** | (2025.01) |
| ***H10H 29/49*** | (2025.01) |
| ***H10H 29/85*** | (2025.01) |
| ***H10W 90/00*** | (2026.01) |
| ***H10W 90/10*** | (2026.01) |

(52) U.S. Cl.
CPC ............ *H10H 29/39* (2025.01); *H10H 29/49* (2025.01); *H10H 29/857* (2025.01); *H10W 90/00* (2026.01); *H10W 90/10* (2026.01); *H10W 90/701* (2026.01); *H10W 90/792* (2026.01)

(58) Field of Classification Search
CPC ........ H10H 29/20; H10H 29/24; H10H 29/39; H10H 29/49; H10H 29/857
See application file for complete search history.

(56) References Cited

U.S. PATENT DOCUMENTS

| | | | | |
|---|---|---|---|---|
| 2009/0244469 | A1* | 10/2009 | Lin | G02F 1/13452 349/149 |
| 2011/0169173 | A1 | 7/2011 | Mun et al. | |
| 2018/0090037 | A1* | 3/2018 | Tso | G09F 9/301 |
| 2020/0013761 | A1* | 1/2020 | Chaji | H10D 86/40 |
| 2021/0364861 | A1* | 11/2021 | Lum | G02F 1/133601 |

FOREIGN PATENT DOCUMENTS

| | | | | | |
|---|---|---|---|---|---|
| CN | 205016161 | U | | 2/2016 | |
| CN | 206076285 | U | | 4/2017 | |
| CN | 207611791 | U | | 7/2018 | |
| CN | 108957852 | A | | 12/2018 | |
| CN | 110120379 | A | | 8/2019 | |
| CN | 111599306 | A | | 8/2020 | |
| CN | 111913323 | A | | 11/2020 | |
| CN | 112310140 | A | | 2/2021 | |
| CN | 114530121 | A | * | 5/2022 | G09G 3/3208 |
| KR | 20220078777 | A | * | 6/2022 | G06F 3/0445 |
| WO | WO-2022160220 | A1 | * | 8/2022 | H10W 90/00 |

OTHER PUBLICATIONS

Written Opinion of the International Search Authority in international application No. PCT/CN2021/083842,mailed on Nov. 11, 2021.
Chinese Office Action issued in corresponding Chinese Patent Application No. 202110185649.5 dated Aug. 11, 2022, pp. 1-6.
Chinese Office Action issued in corresponding Chinese Patent Application No. 202110185649.5 dated Mar. 31, 2023, pp. 1-6.

* cited by examiner

ARRAY SUBSTRATE, BACKLIGHT MODULE AND DISPLAY PANEL

FIELD OF INVENTION

The present invention relates to a field of display technologies, especially relates to an array substrate, a backlight module, and a display panel.

BACKGROUND OF INVENTION

Micro-light emitting diode (Micro-LED) display development has become one of hot spots of future display technologies. Compared to conventional liquid crystal display panels and organic light emitting diode display devices, Micro-LEDs display panel have advantages of fast response, high color gamut, high resolution, low power consumption, etc. However, technical difficulties are many and technologies, especially the key technology mass transfer technologies, are complicated, the miniaturization of light emitting diode (LED) particles has become a technical bottleneck. A mini-light emitting diode (Mini-LED), serving as a product combining the Micro-LED and the backplate, has advantages such as high contrast, high color rendering ability which are comparable to OLED, has a cost slightly which is higher than the cost of the LCD and is only 60% of the cost of the OLED, and is easier to implement than the OLED. Therefore, the Mini-LED becomes a layout hotspot for display panel manufacturers.

With reference to FIG. 1, FIG. 1 is a schematic view of conventional driver chips bonded on a backplate and connected to Mini-LEDs. Each of the driver chips 1 comprises a first pin VCC, a second pin VSS, a third pin Di, a fourth pin Out, and a fifth pin GND, and a first signal line 2, a second signal line 3, a third signal line 4, a fourth signal line 5, and a power line 6 are disposed on the backplate. The first signal line 1 is electrically connected to the first pin VCC of the driver chips 1 to transmit a carrier signal to the driver chip 1. The second signal line 3 is electrically connected to the second pin VSS on the driver chips 1. The third signal line 4 is electrically connected to the third pins Di and the fourth pins Out on two of the driver chips 1 to implement signal transmission between the two driver chips 1. The fourth signal line 5 is electrically connected to the fifth pins GND of the driver chips 1 to input a grounding signal. One end of the LED is connected to the fourth pins Out, another end of the LED is connected to the power line 6, an overlap is defined between the third signal line 4 and the second signal line 3.

Therefore, it is necessary to set forth a technical solution to solve the issue of the overlapped third signal line and second signal line electrically to the driver chips in the conventional technologies which disadvantages the layout.

SUMMARY OF INVENTION

Technical Problems

An objective of the present invention is to provide an array substrate, a backlight module and a display panel, to solve an overlapping issue of signal lines electrically to driver chips in the conventional technologies.

Solutions to Problems

Technical Solutions

A backlight module, the backlight module comprises:

a substrate comprising at least two first bonding regions;

at least one first conductive pad in each of the first bonding regions of the substrate;

at least two second conductive pads disposed in each of the first bonding regions of the substrate;

first wires disposed on the substrate and each of which is connected to at least two of the first conductive pad in the first bonding regions;

a second wire disposed on the substrate and connected to two of the second conductive pads located in two of the first bonding regions respectively; and driver chips connected to the first conductive pad and the second conductive pads in each of the first bonding regions;

wherein two of the second conductive pads connected to the second wire are located on the same side of each of the first wires.

A display panel, the display panel comprises:

a substrate, the substrate comprises at least two first bonding regions;

at least one first conductive pad disposed in each of the first bonding regions on the substrate;

at least two second conductive pads disposed in each of the first bonding regions on the substrate;

first wires disposed on the substrate and each of which is connected to at least two of the first conductive pads in the first bonding regions;

a second wire disposed on the substrate disposed on the substrate and connected to two of the second conductive pads located in two of the first bonding regions respectively; and driver chips connected to the first conductive pad and the second conductive pads in each of the first bonding regions;

wherein two of the second conductive pads connected to the second wire are located on the same side of each of the first wires.

An array substrate, the array substrate comprises:

a substrate, the substrate comprises at least two first bonding regions;

at least one first conductive pad disposed in each of the first bonding regions on the substrate;

at least two second conductive pads disposed in each of the first bonding regions on the substrate;

first wires disposed on the substrate and each of which is connected to at least two of the first conductive pads in the first bonding regions; and a second wire disposed on the substrate disposed on the substrate and connected to two of the second conductive pads located in two of the first bonding regions respectively;

wherein two of the second conductive pads connected to the second wire are located on the same side of each of the first wires.

BENEFICIAL EFFECTS OF INVENTION

Beneficial Effects

The present invention provides an array substrate, a backlight module, and a display panel, by locating two second conductive pads connected to a second wire on the same side of first wires, avoids an overlap between the first wires and the second wire, which advantages disposing the second wire, the second conductive pads connected to the second wire, the first wires, and the first conductive pad connected to the first wires on the same metal layer. A number of metal film layers are decreased while layout is simplified, which facilitates improving a yield rate and lowering a cost.

BRIEF DESCRIPTION OF DRAWINGS

Description of Drawings

Figure 1:
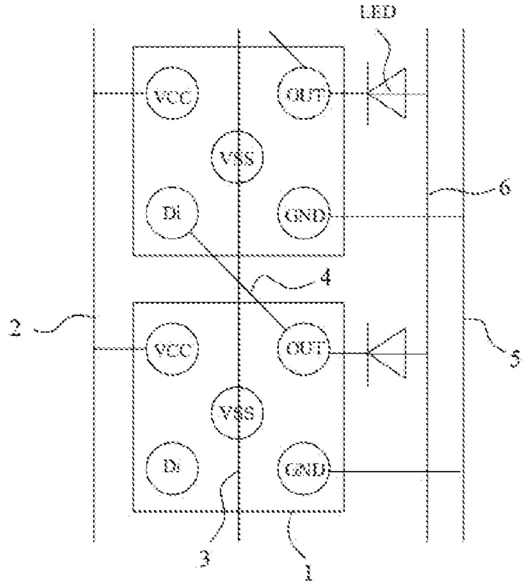
FIG. 1 PRIOR ART
Figure 2:
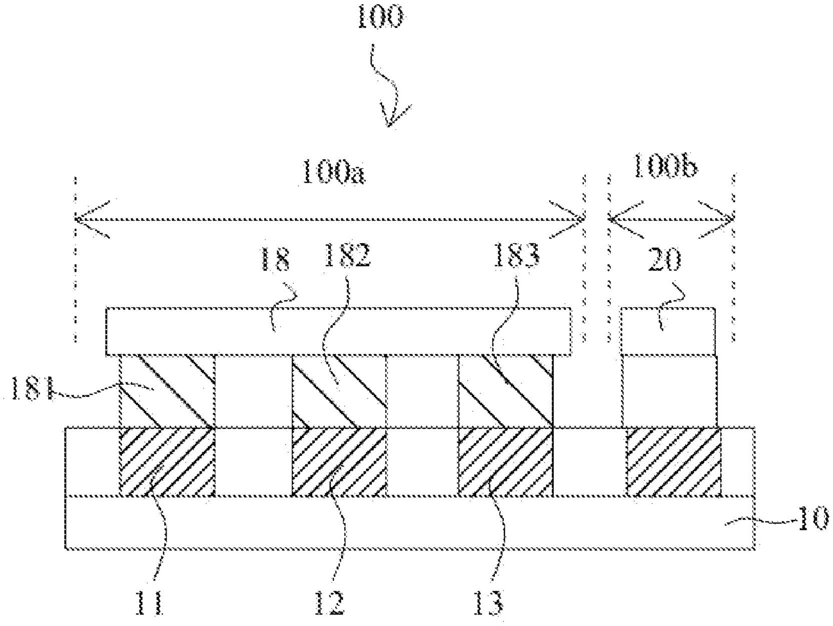
Figure 3:
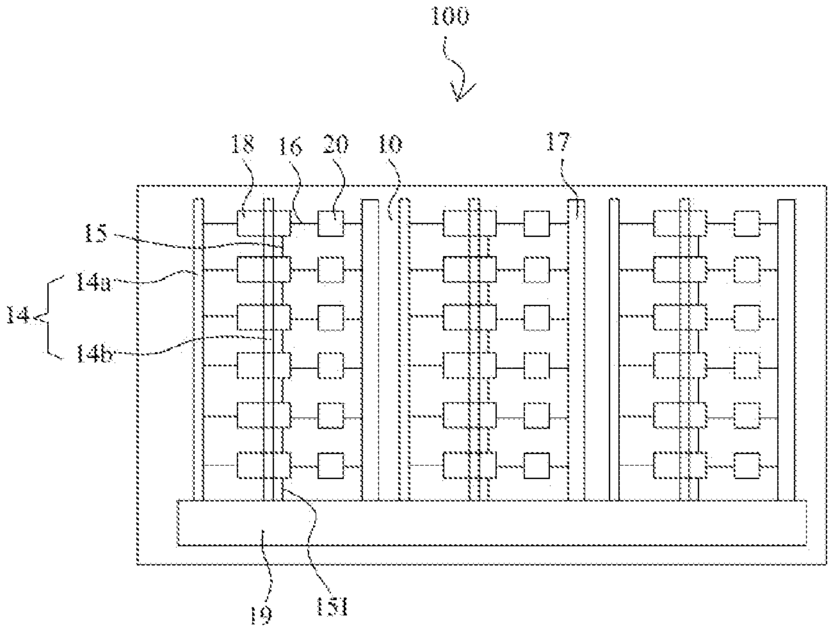
Figure 4:
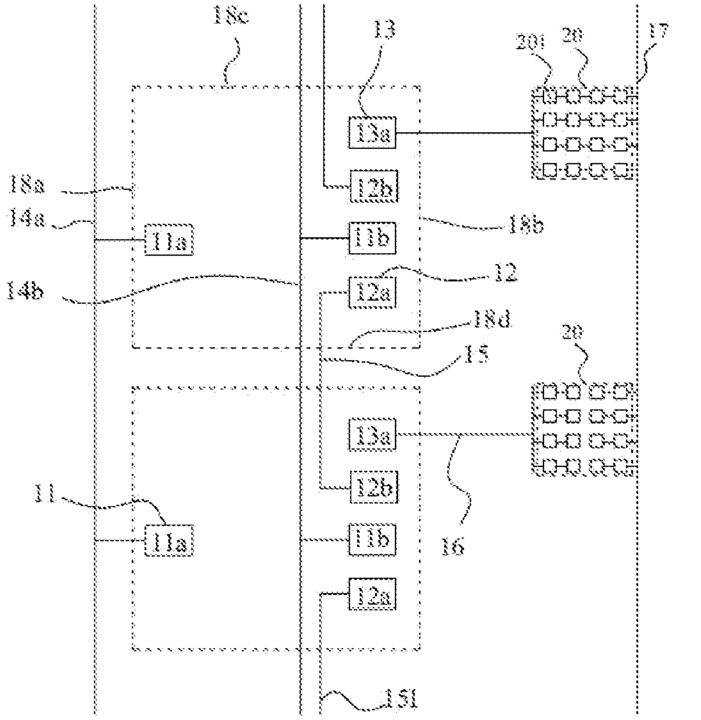
Figure 5:
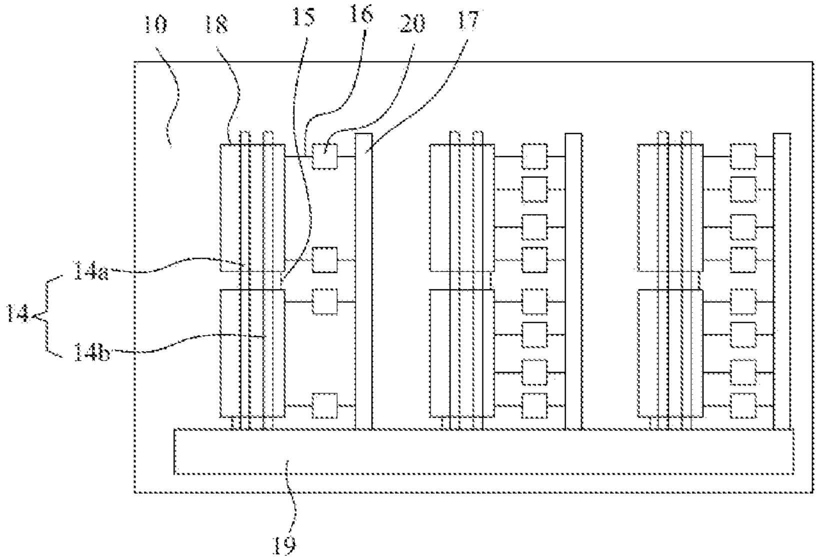
Figure 6:
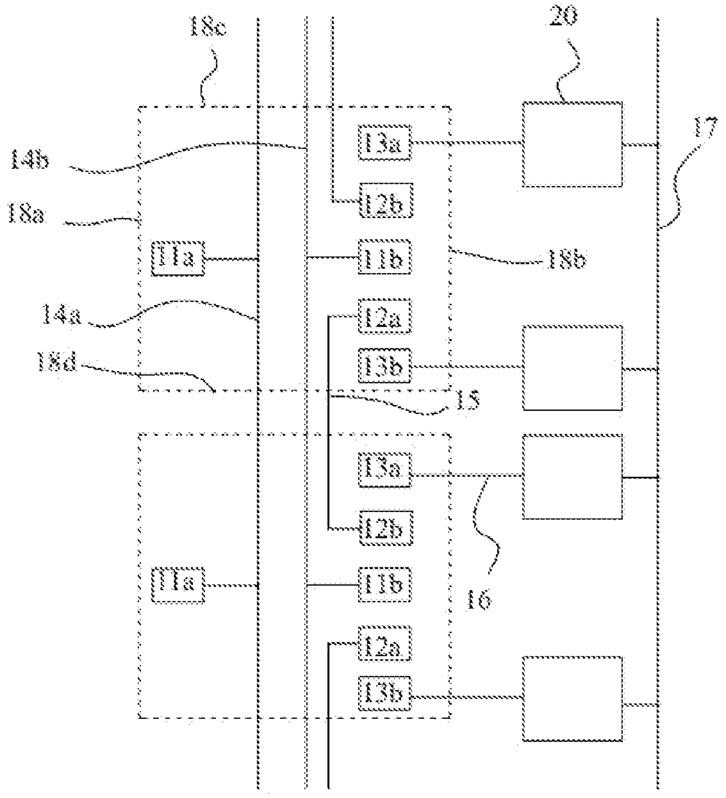
Figure 7:
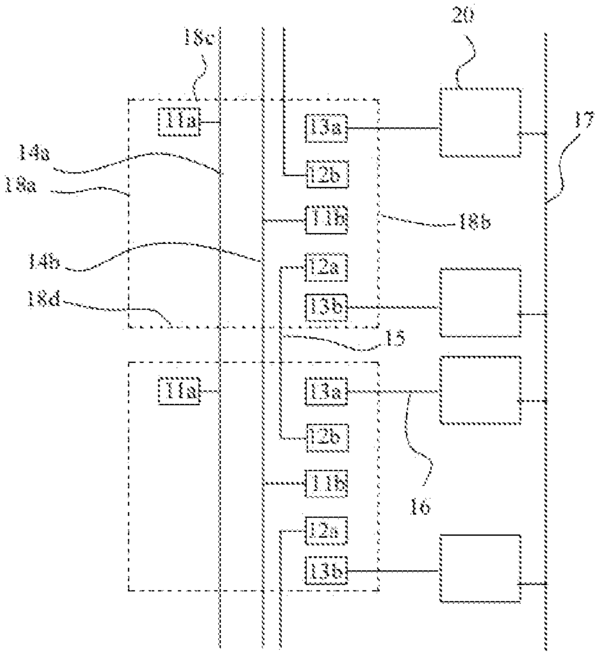
Figure 8:
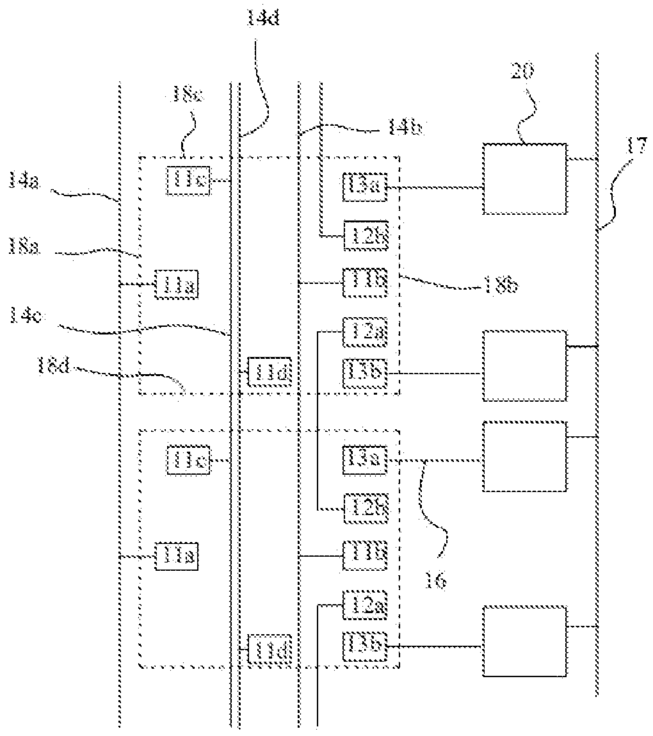
Figure 9:
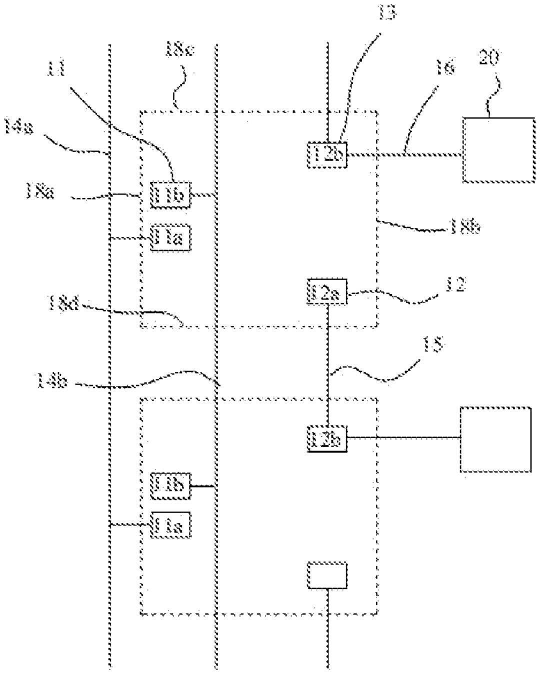
Figure 10:
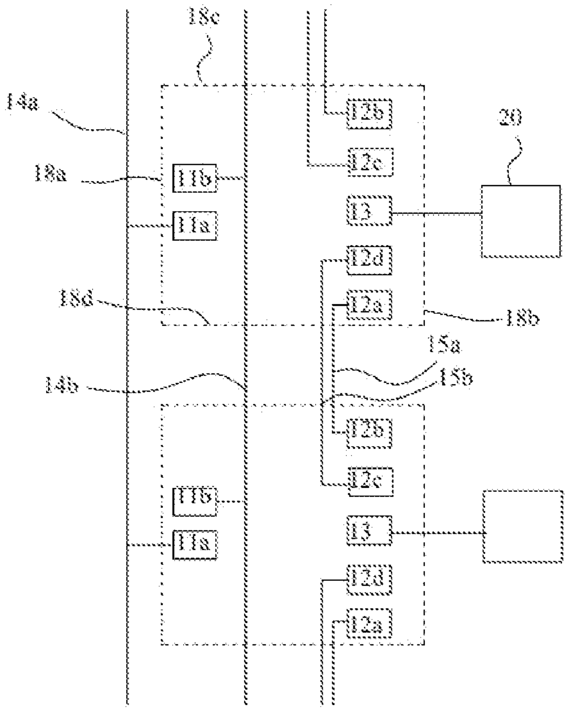
Figure 11:
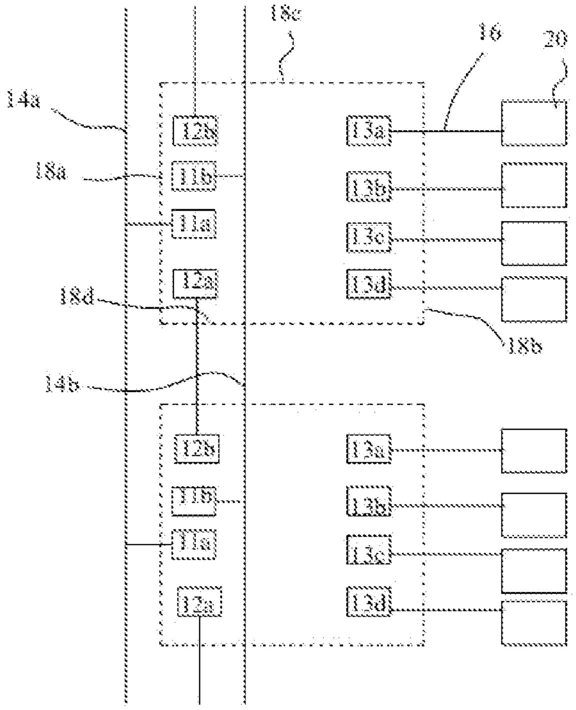
Figure 12:
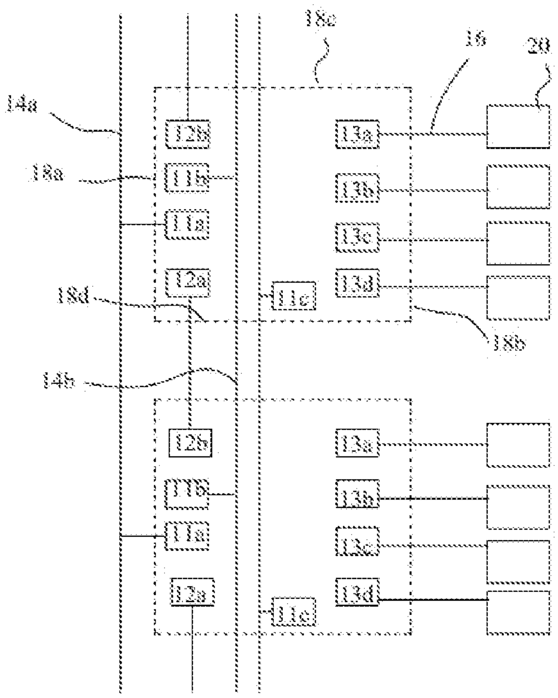
Figure 13:
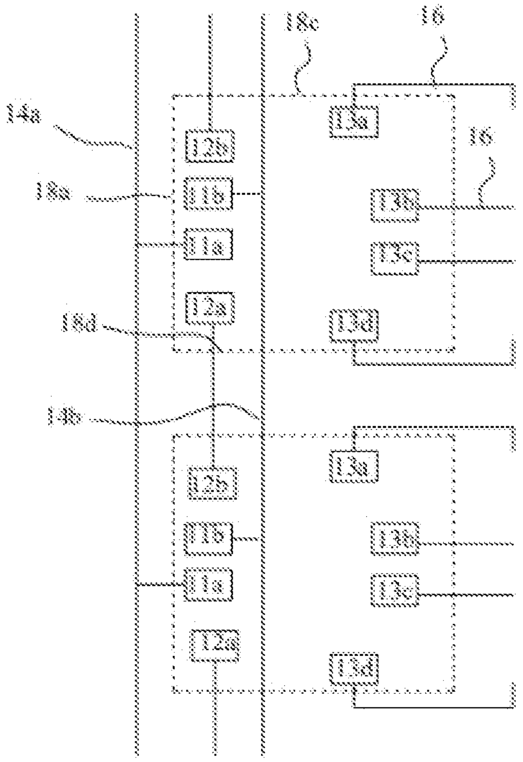
Figure 14:
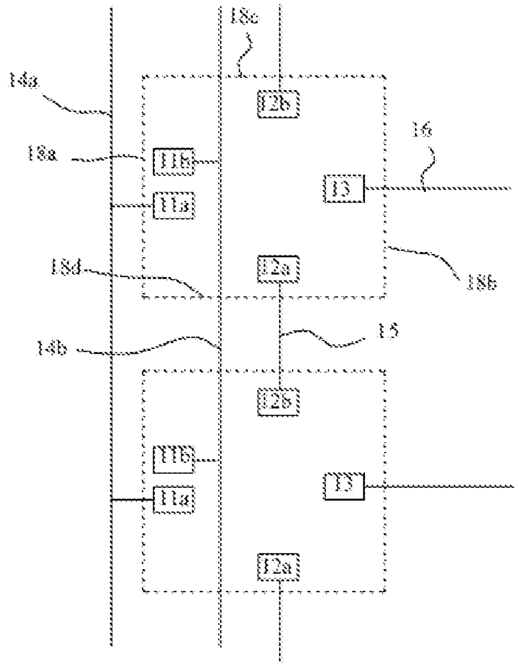
Figure 15:
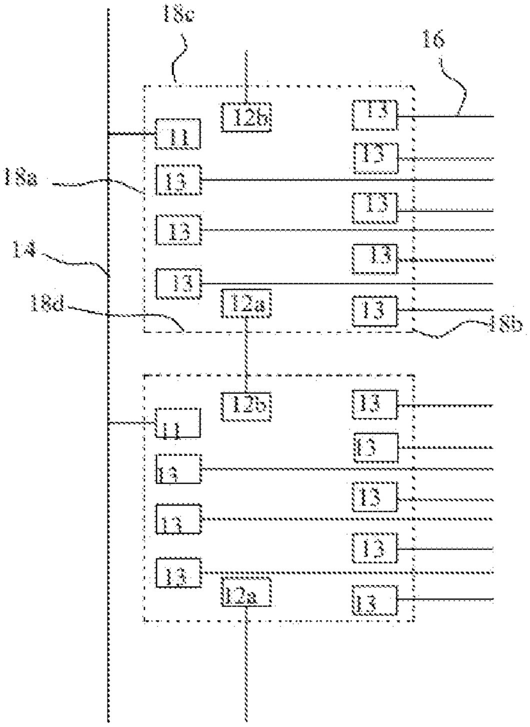
Figure 16:
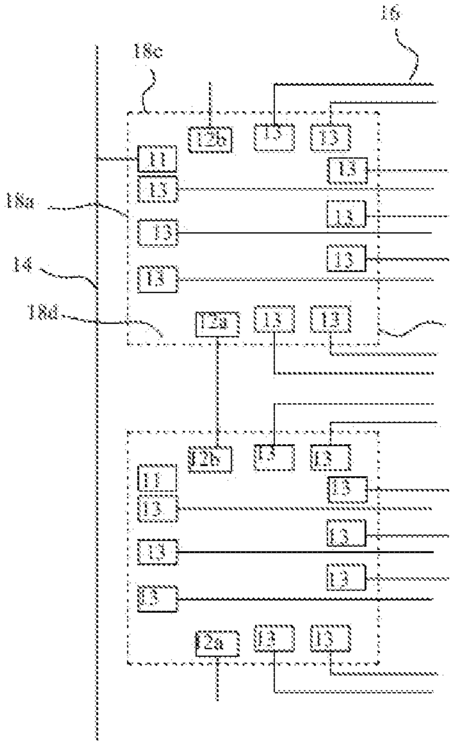
Figure 17:
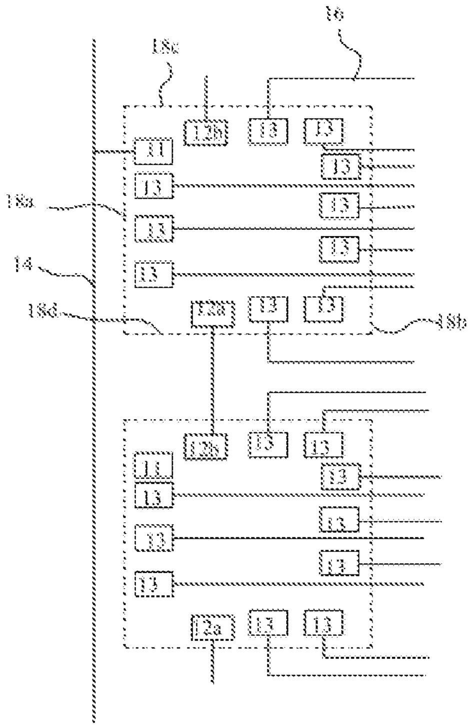
Figure 18:
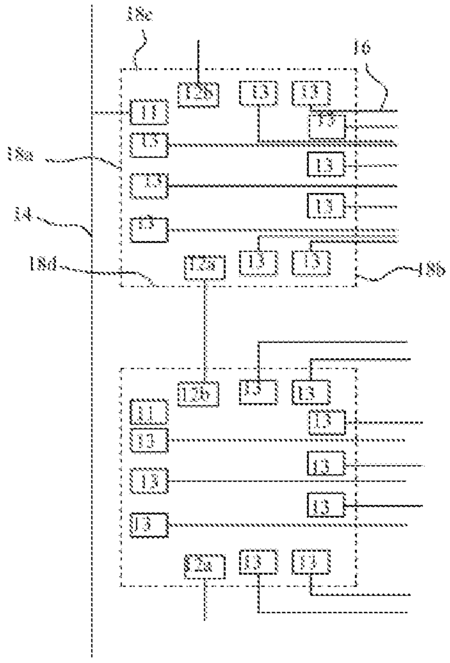

FIG. 1 is a schematic view of conventional driver chips bonded on a backplate and connected to Mini-LEDs;

FIG. 2 is a schematic cross-sectional view a backlight module of a first embodiment of the present invention;

FIG. 3 is a first schematic plan view the backlight module of the first embodiment of the present invention;

FIG. 4 is a first schematic partially enlarged view of the backlight module shown in FIG. 3;

FIG. 5 is a first schematic plan view of the backlight module of a second embodiment of the present invention;

FIG. 6 is a first schematic partially enlarged view of the backlight module shown in FIG. 5;

FIG. 7 is a second schematic partially enlarged view of the backlight module shown in FIG. 5;

FIG. 8 is a first schematic partially enlarged view of the backlight module of a third embodiment of the present invention;

FIG. 9 is a second schematic partially enlarged view of the backlight module shown in FIG. 3;

FIG. 10 is a schematic partially enlarged view the backlight module of a fourth embodiment of the present invention;

FIG. 11 is a schematic partially enlarged view of the backlight module of a fifth embodiment of the present invention;

FIG. 12 is a schematic partially enlarged view of the backlight module of a sixth embodiment of the present invention;

FIG. 13 is a schematic partially enlarged view of the backlight module of a seventh embodiment of the present invention;

FIG. 14 is a schematic partially enlarged view of the backlight module of an eighth embodiment of the present invention;

FIG. 15 is a schematic partially enlarged view of the backlight module of a ninth embodiment of the present invention;

FIG. 16 is a schematic partially enlarged view of the backlight module of a tenth embodiment of the present invention;

FIG. 17 is a schematic partially enlarged view of the backlight module of an eleventh embodiment of the present invention; and FIG. 18 is a schematic partially enlarged view of the backlight module of a twelfth embodiment of the present invention.

EMBODIMENTS OF INVENTION

Embodiments of Invention

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

With reference to FIGS. 2 and 3, FIG. 2 is a schematic cross-sectional view of a backlight module of a first embodiment of the present invention, FIG. 3 is a first schematic plan view of the backlight module of the first embodiment of the present invention. The backlight module 100 comprises a substrate 10, at least one first conductive pad 11, at least two second conductive pads 12, at least one third conductive pad 13, a first wires 14, a second wire 15, a third wire 16, a fourth wire 17, driver chips 18, a flexible printed circuit board 19, and light emitting units 20.

In the present embodiment, the substrate 10 is a glass substrate. It can be understood that the substrate 10 can also be a flexible substrate. The first conductive pad 11, the second conductive pads 12, the third conductive pad 13, the first wires 14, the second wire 15, the third wire 16, and the fourth wire 17 are disposed on the substrate 10. The first conductive pad 11, the second conductive pads 12, the third conductive pad 13, the first wires 14, the second wire 15, the third wire 16, and the fourth wire 17 are disposed on the same metal layer. The metal layer is located on the substrate 10 to reduce a number of the metal layer of the backlight module, simplify manufacturing processes of the backlight module, and lower a manufacturing cost of the backlight module. It can be understood that each of the first conductive pad 11, the second conductive pads 12, the third conductive pad 13, the first wires 14, the second wire 15, third wire 16, and the fourth wire 17 can be disposed on two or more metal layers. Material for manufacturing the metal layer comprises at least one of molybdenum, aluminum, titanium, or copper.

In the present embodiment, the substrate 10 comprises at least two first bonding regions 100*a*. Specifically, the substrate 10 comprises a plurality of first bonding regions 100*a*. The first bonding regions 100*a* are arranged in rows and columns on the substrate 10. One of the driver chips 18 is fixed on one of the first bonding regions 100*a*, and correspondingly, driver chips 18 are arranged in rows and columns. A first conductive pad 11, second conductive pads 12, and a third conductive pad 13 are disposed on each of the first bonding regions 100*a* of the substrate 10, one of the driver chips 18 is connected to one of the first conductive pad 11, the second conductive pads 12, and the third conductive pad 13 of the first bonding regions 100*a*. Each of the driver chips 18 comprises a first pin 181 connected to one of the first conductive pad 11 respectively, a second pin 182 connected to one of the second conductive pads 12, and a third pin 183 connected to one of the third conductive pads 13. Each of the driver chips 18 can further comprise a redundant pin and a test pin. The redundant pin is not supplied with an electrical signal, the test pin a pin configured to test whether the driver chips work normally and is not configured to signal transmission. Electrical connection between the first conductive pad 11*a* and the first pin 181, between the second conductive pad 12 and the second pin 182, or between the third conductive pad 13 and the third pin 183 can be implemented through solder paste or conduction adhesive. With reference to FIG. 4, FIG. 4 is a first schematic partially enlarged view of the backlight module shown in FIG. 3. The driver chips 18 are rectangular, for example, the driver chips 18 are square, an orthographic projection of each of the driver chips 18 on the substrate 10 comprises a first parallel edge 18*a* parallel to an extension direction of the first wires 14 and a second parallel edge 18*b* parallel to the extension direction of the first wires 14, a first perpendicular edge 18*c*, and a second perpendicular edge 18*d*. The first parallel edge 18*a* is opposite to the second parallel edge 18*b*, the first perpendicular edge 18*c* is opposite to the second perpendicular edge 18*d*, the first perpendicular edge 18*c* is perpendicular to the first parallel edge 18*a*, and the second perpendicular edge 18*d* is perpendicular to the first parallel edge 18*a*. The driver chips 18 can also be irregularly shaped.

In the present embodiment, the substrate 10 comprises second bonding regions 100*b*, each of the second bonding regions 100*b* is located on a side of each of the first bonding regions 100*a*. Light emitting units 20 are fixed in the second bonding regions 100*b* respectively, each of the light emitting units 20 comprises rows of light emitting devices 201 in series, the rows of the light emitting devices 201 are electrically connected, a number of each row of the light emitting devices 201 in series is greater than 2, and the light emitting devices 201 are mini-light emitting diodes (mini-LEDs). One end of each of the light emitting units 20 is electrically connected to the driver chip 18 through the third wire 16, another end of the light emitting unit 20 is connected to the fourth wire 17, and the fourth wire 17 is a power line. It can be understood that the light emitting devices 201 can also be micro-light emitting diodes (Micro-LEDs).

In the present embodiment, with reference to FIG. 3, the flexible printed circuit board 19 is mounted securely on the substrate 10, the flexible printed circuit board 19 is electrically connected to the first wires 14, the second wire 15 and the fourth wire 17 to input corresponding electrical signals into the first wires 14, the second wire 15, and the fourth wire 17. The flexible printed circuit board 19 is disposed on an end of the substrate 10 and are on the same surface of the substrate 10 with the first wires 14. The first wires 14 extends to a region fixing the flexible printed circuit board 19. The fifth wire 151 is connected to a portion between the first one of the driver chips 18 near the flexible printed circuit board 19 and the flexible printed circuit board 19, outputs the signal outputted from the flexible printed circuit board 19 to the driver chips 18, and is connected to adjacent two of the driver chips 18 through the second wire 15 to implement signal transmission between the driver chips 18. One end of the fourth wire 17 to a position on which the flexible printed circuit board 19 is located and is electrically connected to the flexible printed circuit board 19. It can be understood that flexible printed circuit board 19 can also be fixed on a rear surface of the substrate 10 on which the first wires 14 is disposed. The flexible printed circuit board 19 plural and each of the flexible printed circuit boards 19 is electrically connected to the first wires 14, the second wire 15, and the fourth wire 17 in some regions. The flexible printed circuit board 17 can also be fixed on two ends of the substrate 10.

In the present embodiment, the first wires 14 are configured to transmit the same signal to the first conductive pad 11*s* in at least two first bonding regions 100*a* transmitting the same signal, and input the signal into the driver chips 18 through the first pin 181 connected to the first conductive pad 11. The first wires 14 is connected to at least two of the first conductive pads 11 in the first bonding regions 100*a*. One first conductive pad 11 transmitting the same signal is disposed on each of the first bonding regions 100*a*, and the at least one first conductive pad 11 of each of the first bonding regions 100*a* is connected correspondingly to the at least one first wire 14. Namely, each of the first conductive pad 11 is only connected to one first wire 14 transmitting corresponding signals. Accordingly, to prevent an overlap of the first conductive pads 11 transmitting different signals when the first conductive pads 11 are disposed along the first parallel edge 18*a* and the second parallel edge 18*b*, at most two of the first conductive pads 11 are disposed along the first parallel edge 18*a*, and/or, at most two of the first conductive pads 11 are disposed along the second parallel edge 18*b*. Namely, at most two of the first conductive pads 11 transmitting different signals are disposed along one of the first parallel edge 18*a* and the second parallel edge 18*b*. It can be understood that two or more first conductive pads 11 transmitting the same signal can also be disposed on each of the first bonding regions 100*a*. The first wires 14 are straight wires and disposed along a column direction.

In the present embodiment, second wire 15 is configured to transmit a signal required for addressing of each of the driver chips 18, and is also configured to output a signal required for working of the driver chips 18. The second wire 15 are connected to two second conductive pads 12 in two of the first bonding regions 100*a* such that signal are transmitted in cascade between two of the driver chips 18. At least two second conductive pads 12 are disposed on each of the first bonding regions 100*a* is disposed with, the second conductive pad 12 of one of the first bonding regions 100*a* is connected to the second conductive pad 12 of another of the first bonding regions 100*a* through the second wire 15, one of the second conductive pads 12 inputs the signal outputted from one of the driver chips 18 to the other of the driver chips 18, another one of the second conductive pads 12 inputs the signal outputted from one of the driver chips 18 to one of the driver chips 18. Namely, the at least two second conductive pads 12 comprises first type second conductive pads and second type second conductive pads, the first type second conductive pads output signals from the driver chips 18, the second type second conductive pads input signals into the driver chips 18. Furthermore, the second wire 15 connected to two of the second conductive pads 12 and the two second conductive pads 12 connected to the second wire 15 constitute a set of cascade unit to transmit a cascade signal between the two driver chips 18. Multiple sets of cascade units can be adopted to transmit various cascade signals. The second wire 15 extends along a column direction, namely, the extension directions of the first wires 14 and the second wire 15 are the same. The second wire 15 is straight and is parallel to the first wires 14.

In the present embodiment, in each of the first bonding regions 100*a*, at least one second conductive pad 12 and at most one first conductive pad 11 connected to the second wire 15 are disposed along the second parallel edge 18*b*; and/or, in each of the first bonding regions 100*b*, at least one second conductive pad 12 and at most two of the first conductive pads 11 connected to the second wire 15 are disposed along the first parallel edge 18*a*. At most two of the first conductive pads 11 disposed along the first parallel edge 18*a* are located on disposed on a side of the at least one second conductive pad 12 away from the second wire 15 connected to the second conductive pad 12 along the first parallel edge 18*a* or the second parallel edge 18*b*. The at most one first conductive pad disposed along the second parallel edge 18*b* is located on a side of the at least one second conductive pad 12 disposed along the first parallel edge or the second parallel edge away from the second wire 15 connected to the second conductive pads.

Furthermore, with reference to FIG. 4, two of the second conductive pads 12 (the second conductive pad 12*a* and the second conductive pad 12*b*) connected to the second wire 15 are located on the same side of each of the first wires 14 such that when two second conductive pads 12 are connected through the second wire 15, the second wire 15 would not overlap with the first wires 14, which prevents shorting risks resulted from the overlapped second wire 15 and the first wires 14, optimizes layout design of the backlight module such that the first wires 14, the first conductive pad 11, the second wire 15, and the second conductive pads 12 can be disposed in the same layer to reduce a number of metal layers required by the backlight module and lower manufacturing processes while simplifying the manufacturing processes of the backlight module.

In the present embodiment, the third wire 16 transmits the signal in the driver chip 18 to the light emitting unit 20, an end of the third wire 16 is connected to the third conductive pad 13, another end of the third wire 16 is connected to an end of the light emitting unit 20, the third wire 16 extends from a position of the third conductive pad 13 to a side of the second parallel edge 18*b* away from the first parallel edge 18*a*. The first wire 14 is located on a side of the second parallel edge near the first parallel edge 18*a*. In each of the first bonding regions 100*a*, at least one third conductive pad 13 is disposed on a side of the first wires 14 near the second parallel edge 18*b*.

With reference to FIGS. 3 and 4, a plurality of first conductive pads 11 are disposed on each of the first bonding regions 100*a*, the first conductive pads 11 in each of the first bonding regions 100*a* can transmit the same signal, and can transmit different signals. The first conductive pads 11 comprises a first type first conductive pad 11*a* and a second type first conductive pad 11*b*. The first type first conductive pad 11*a* and the second type first conductive pad 11*b* transmit different signals. The first wires 14 are plural and the first wires 14 comprise a first wires 14*a* and a first wires 14*b*. The first wire 14*a* is connected to a column of first type first conductive pads 11*a* in first bonding region 100*a*. The first wires 14*b* are connected to a column of second type first conductive pads 11*b* in the first bonding regions 100*a*. The first wire 14*a* can be a GND transmission line, and the first wire 14*b* can be a transmission line for transmitting voltage required for working of the driver chip 18 and the light emitting unit 20. The first wire 14*b* can also be a GND transmission line, and the first wire 14*a* can be a transmission line for transmitting voltage required for working of the driver chip 18 and the light emitting unit 20.

With reference to FIGS. 4 and 6 to 8, in each of the first bonding regions 100*a*, the first type first conductive pad 11*a* and the second type first conductive pad 11*b* are disposed on different edges of an orthographic projection of the driver chips 18 on the substrate 10 respectively.

With reference to FIG. 4, a first type first conductive pad 11*a* is disposed along the first parallel edge 18*a*, a second type first conductive pad 11*b* is disposed along the second parallel edge 18*b*, and the first type first conductive pad 11*a* and the second type first conductive pad 11*b* are arranged abreast along a row direction. One first type first conductive pad 11*a* is connected to the first wire 14*a*, and one second type first conductive pad 11*b* is connected to the first wire 14*b*. The first wire 14*a* connected to one first type first conductive pad 11*a* is located on a side of the first parallel edge 18*a* away from the second parallel edge 18*b*. The first wire 14*b* connected to one second type first conductive pad 11*b* is located between the first parallel edge 18*a* and the second parallel edge 18*b*.

With reference to FIGS. 5 and 6, FIG. 5 is a first schematic plan view of the backlight module of a second embodiment of the present invention, FIG. 6 is a first schematic partially enlarged view of the backlight module shown in FIG. 5. The backlight module shown in FIG. 6 is substantially the same as the backlight module shown in FIG. 4, and a difference thereof is that the first wire 14*a* connected to the first type first conductive pad 11*a* and the first wire 14*b* connected to the second type first conductive pad 11*b* are located between the first parallel edge 18*a* and the second parallel edge 18*b*. The first wire 14*a* connected to the first type first conductive pad 11*a* is disposed near the first parallel edge 18*a*, the first wire 14*b* connected to the second type first conductive pad 11*b* is disposed near the second parallel edge 18*b*. The first wire 14*a* is parallel to the first wire 14*b*. The backlight module shown in FIG. 6 is different from the backlight module shown in FIG. 4 in difference of positions of the first wires 14*a*, which results in different sizes of the driver chips 18 of the backlight module.

With reference to FIG. 7, FIG. 7 is a second schematic partially enlarged view of the backlight module shown in FIG. 5. The backlight module shown in FIG. 7 is substantially the same as the backlight module shown in FIG. 6, and a difference thereof is that a first type first conductive pad 11*a* is disposed along the first perpendicular edge 18*c*, and a second type first conductive pad 11*b* is disposed along the second parallel edge 18*b*.

With reference to FIG. 8, FIG. 8 is a first schematic partially enlarged view of the backlight module of a third embodiment of the present invention. The backlight module shown in FIG. 8 is substantially the same as the backlight module shown in FIG. 4, and a difference thereof is that the backlight module shown in FIG. 8 further comprises a third type first conductive pad 11*c* and a fourth type first conductive pad 11*d*. The third type first conductive pad 11*c* is disposed along the first perpendicular edge 18*c* and is connected to the first wire 14*c*. The fourth type first conductive pad 11*d* is disposed along the second perpendicular edge 18*d* and is connected to the first wire 14*d*. The first wire 14*a* is disposed on a side of the first parallel edge 18*a* away from the first conductive pad 11*a*. The first wire 14*b*, the first wire 14*c*, and the first wire 14*d* are disposed between the first parallel edge 18*a* and the second parallel edge 18*b*, and the first wire 14*d* is disposed between the first wire 14*b* and the first wire 14*c*. The first wire 14*b* is disposed near the second parallel edge 18*b*. The first wire 14*a*, the first wire 14*b*, the first wire 14*c* and the first wires 14*d* are parallel to each other. It can be understood that the third type first conductive pad 11*c* can also be disposed on the first parallel edge 18*a*. the signal transmitted by the third type first conductive pad 11*c* and the signals transmitted by the first type first conductive pad 11*a* and the second type first conductive pad 11*b* are different.

As described above, the first conductive pad 11 can be disposed along at least one of the first parallel edge 18*a*, the second parallel edge 18*b*, the first perpendicular edge 18*c*, and the second perpendicular edge 18*d*, and can be disposed along different edges. When the third conductive pad 13 is disposed along the second parallel edge 18*b*, at most two of the first conductive pads 11 are disposed along the first parallel edge 18*a*, and at most one first conductive pad 11 is along the second parallel edge 18*b*. Furthermore, the first conductive pad 11 can be disposed along at least one of the first perpendicular edge 18*c* and the second perpendicular edge 18*d*. However, when the first conductive pad 11 are disposed along at least one of the first perpendicular edge 18*c* and the second perpendicular edge 18*d*. It should be noted to prevent an overlap between the first wire 14 connected to the first conductive pad 11 and the third wire 16 connected to the third conductive pad 13. For example, when the first conductive pad 11 and the third conductive pad 13 simultaneously disposed along at least one of the first perpendicular edge 18*c* and the second perpendicular edge 18*d*, the first conductive pad 11 is disposed on a side of the third conductive pad 13 away from an extension direction of the third wire 16 connected to the third conductive pad 13.

Furthermore, in each of the first bonding regions, at least one third conductive pad is disposed along at least one of the first perpendicular edge and the second perpendicular edge, and/or, the at least one first conductive pad is disposed along at least one of the first perpendicular edge and the second perpendicular edge.

In FIGS. 4, 6, 7, and 8, in each of the first bonding regions 100*a*, at least two second conductive pads 12 are disposed along the second parallel edge 18*b*, and the at least two second conductive pads 12 disposed along the second parallel edge 18*b* are located respectively on two opposite sides of the second type first conductive pad 11*b* to prevent the second wire 15 connected to two of the second conductive pads 12 respectively in two of the first bonding regions 100*a* from overlapping with the first wire 14*b* connected to the second type first conductive pad 11*b*. Specifically, a first type second conductive pad 12*b* and a second type second conductive pad 12*a* are disposed on each of the first bonding regions 100*a*. The first type second conductive pad 12*b* outputs a signal from the driver chip 18, the second type second conductive pad 12*a* inputs a signal into the driver chip 18. The first type second conductive pad 12*b* in one of the first bonding regions 100*a* is connected to the second type second conductive pad 12*a* in another of the first bonding regions 100*a* through the second wire 15 to achieve transmission of a cascade signal between two of the driver chips 18.

Furthermore, with reference to FIGS. 4 to 8, one of the driver chips 18 is electrically connected to one of the light emitting unit 20 or light emitting units 20 through the third wire 16. A number of the light emitting units 20 driven by one of the driver chips 18 depends on a number of the third conductive pads 13 and a number of third input pins 183 on the driver chip 18 in one of the first bonding regions 100*a*. The more the number of the third conductive pad 13 in one of the first bonding regions 100*a*, the more the number of the light emitting units 20 driven by a corresponding one of the driver chips 18.

With reference to FIGS. 9 to 12, in each of the first bonding regions 100*a*, the first type first conductive pad 11*a* and the second type first conductive pad 11*b* are disposed along the same edge of an orthographic projection of the driver chip 18 on the substrate.

With reference to FIG. 9, FIG. 9 is a second schematic partially enlarged view of the backlight module shown in FIG. 3. Each of the first bonding regions 100*a*, the first type first conductive pad 11*a*, and the second type first conductive pad 11*b* are disposed along the first parallel edge 18*a*. The first wire 14*a* connected to the first type conductive pad 11*a* and the first wire 14*b* connected to the second type first conductive pad 11*b* are located on two sides of the first parallel edge 18*a* respectively. Furthermore, With reference to FIG. 9, in each of the first bonding regions 100*a*, at least two second conductive pads 12 are disposed along the second parallel edge 18*b*, one second conductive pad 12 of the at least two second conductive pads 12 is connected to the light emitting unit 20 through the third wire 16, namely, one second conductive pad 12 is multiplexed as the third conductive pad 13. The first conductive pad 12 transmits signals to the light emitting unit 20 and to other driver chips 18 by time division multiplexing. The at least two second conductive pads 12 comprises a first type second conductive pads 12*b* and a second type second conductive pads 12*a*, the first type second conductive pads 12*b* and the second type second conductive pads 12*a* are disposed along the second parallel edge 18*b*. The first type second conductive pads 12*b* is the third conductive pad 13 outputting a signal to the light emitting units 20 by time division multiplexing. The first type second conductive pad 12*b* in one of the first bonding regions 100*a* is connected to the second type second conductive pad 12*a* in another of the first bonding regions 100*a* through the second wire 15. When the second type second conductive pads 12*a* outputs a signal to other driver chips 18, the first type second conductive pads 12*b* outputs a signal from the driver chip 18, the second type second conductive pads 12*a* inputs the signal into the driver chip 18.

With reference to FIG. 10, FIG. 10 is a schematic partially enlarged view the backlight module of a fourth embodiment of the present invention. The backlight module shown in FIG. 10 is substantially the same as the backlight module shown in FIG. 19, and a difference thereof is that in each of the first bonding regions 100*a*, at least two second conductive pads 12 are disposed along the second parallel edge 18*b*. Specifically, the at least two second conductive pads 12 comprises a first type second conductive pads 12*b*, a second type second conductive pads 12*a*, a third type second conductive pads 12*c*, and a fourth type second conductive pads 12*d*. In the first bonding region 100*a*, the first type second conductive pad 12*b* and the second type second conductive pad 12*a* are located two sides of the third type second conductive pad 12*c* and the fourth type second conductive pads 12*d*, the third type second conductive pad 12*c* is disposed near the first type second conductive pad 12*b*, and the fourth type second conductive pad 12*d* is disposed near the second type second conductive pads 12. The first type second conductive pad 12*b* in one of the first bonding regions 100*a* is connected to the second type second conductive pad 12*a* in another of the first bonding regions 100*a* through the second wire 15*a*. The fourth type second conductive pad 12*d* in one of the first bonding regions 100*a* is connected to the third type second conductive pad 12*c* in another of the first bonding regions 100*a* through the second wire 15*b*. The second wire 15*a* is parallel to the second wire 15*b*. The third type second conductive pad 12*c* and the first type second conductive pad 12*b* output signals from the driver chip 18, signals transmitted by the third type second conductive pad 12*c* and the first type second conductive pad 12*b* are different. The second type second conductive pad 12*a* and the fourth type second conductive pad 12*d* receive signals externally and transmit the signals to the driver chip 18. The signals transmitted by the second type second conductive pad 12*a* and the fourth type second conductive pad 12*d* are different.

With reference to FIG. 11, FIG. 11 is a schematic partially enlarged view of the backlight module of a fifth embodiment of the present invention. The backlight module shown in FIG. 11 is substantially similar to the backlight module shown in FIG. 9, and a difference thereof is that in each of the first bonding regions 100*a*, at least two second conductive pads 12 are disposed along the first parallel edge 18*a*, the first type first conductive pad 11*a* and the second type first conductive pad 11*b* are disposed between adjacent two second conductive pads 12. Specifically, the first type first conductive pad 11*a* and the second type first conductive pad 11*b* are disposed between the two second conductive pads 12, the two second conductive pads 12 are the same as the two second conductive pads 12 (the first type second conductive pads and the second type second conductive pads) previously described, and would not be described herein. Furthermore, a plurality of third conductive pads 13 are disposed on the second parallel edge 18*b*, the third conductive pads 13 comprises a third conductive pad 13*a*, a third conductive pad 13*b*, a third conductive pad 13*c*, and a third conductive pad 13*d*.

With reference to FIG. 12, FIG. 12 is a schematic partially enlarged view of the backlight module of a sixth embodiment of the present invention. The backlight module shown in FIG. 12 is substantially the same as the backlight module shown in FIG. 11, and a difference thereof is that the backlight module shown in FIG. 12 further comprises a third type first conductive pad 11*c*, the third type first conductive pad 11*c* is disposed on the second perpendicular edge 18*d* and is connected to the first wires, the first wires connected to the third type first conductive pad 13*c* are parallel to the first wires 14*a*.

With reference to FIG. 13, FIG. 13 is a schematic partially enlarged view of the backlight module of a seventh embodiment of the present invention. The backlight module shown in FIG. 13 is substantially the same as the backlight module shown in FIG. 11, and a difference thereof is that the third conductive pad 13*a* is disposed along the first perpendicular edge 18*a*, and the third conductive pad 13*d* is disposed along the second perpendicular edge 18*d*.

With reference to FIG. 14, FIG. 14 is a schematic partially enlarged view of the backlight module of an eighth embodiment of the present invention. The backlight module shown in FIG. 14 is substantially the same as the backlight module shown in FIG. 9, and a difference thereof is that the second conductive pads are not multiplexed as third conductive pads 13. In each of the first bonding regions 100*a*, the two second conductive pads 12 connected to the second wire 15 are disposed along the first perpendicular edge 18*a* and the second perpendicular edge 18*b* respectively, and one third conductive pad 13 is disposed along the second parallel edge 18*b*.

With reference to FIGS. 15 to 18, at least one third conductive pad 13 is disposed along the first parallel edge 18*a*. One first conductive pad 11 is disposed on each of the first bonding regions 100*a*, and the first conductive pad 11 is disposed along the first parallel edge 18*a* to prevent an overlap between the first wires 14 connected to the first conductive pad 11 and the third wire 16 connected to the third conductive pad 13. Furthermore, at least one third conductive pad 13 can also be disposed on the second parallel edge 18*b*, the first perpendicular edge 18*c*, and the second perpendicular edge 18*d*. The third conductive pad 13, when disposed along the first parallel edge 18*a*, can be staggered with the third conductive pad 13 of the second parallel edge 18*b* such that the third wire 16 connected to the third conductive pad 13 disposed along the first parallel edge 18*a* can extend through a gap between two adjacent two of the third conductive pads 13 disposed along the second parallel edge 18*b*. Furthermore, when the third conductive pad 13 is disposed along the first perpendicular edge 18*c* and the second perpendicular edge 18*d*, the third wire 16 connected to the third conductive pad 13 extend toward a side (upward or downward) and then extends along a side of the second parallel edge 18*b* away from the first parallel edge 18*a*.

The present invention further provides a display panel, wherein the display panel comprises: a substrate, the substrate comprises at least two first bonding regions; at least one first conductive pad disposed in each of the first bonding regions on the substrate; at least two second conductive pads disposed in each of the first bonding regions on the substrate; first wires disposed on the substrate and each of which is connected to at least two of the first conductive pads in the first bonding regions;

a second wire disposed on the substrate disposed on the substrate and connected to two of the second conductive pads located in two of the first bonding regions respectively; and driver chips connected to the first conductive pad and the second conductive pads in each of the first bonding regions; wherein two of the second conductive pads connected to the second wire are located on the same side of each of the first wires. The technical solution of the above backlight module is also applied to the display panel, which would not be described in detail herein.

The present invention further provides an array substrate, wherein the array substrate comprises: a substrate, the substrate comprises at least two first bonding regions; at least one first conductive pad disposed in each of the first bonding regions on the substrate; at least two second conductive pads disposed in each of the first bonding regions on the substrate; first wires disposed on the substrate and each of which is connected to at least two of the first conductive pads in the first bonding regions; and a second wire disposed on the substrate disposed on the substrate and connected to two of the second conductive pads located in two of the first bonding regions respectively; wherein two of the second conductive pads connected to the second wire are located on the same side of each of the first wires.

The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. A backlight module, wherein the backlight module comprises:

a substrate comprising at least two first bonding regions;

first conductive pads in each of the first bonding regions of the substrate, wherein the first conductive pads provided in each of the first bonding regions comprise a first type first conductive pad and a second type first conductive pad;

at least two second conductive pads disposed in each of the first bonding regions of the substrate;

first wires disposed on the substrate, wherein the first type first conductive pad provided in each of the first bonding regions is connected to one first wire of the first wires, and the second type first conductive pad provided in each of the first bonding regions is connected to another first wire of the first wires;

a second wire disposed on the substrate and connected to two of the second conductive pads located in two of the first bonding regions respectively; and driver chips disposed in the first bonding regions in one-to-one correspondence, wherein each of the driver chips is connected to the first conductive pads and the second conductive pads provided in a corresponding one of the first bonding regions;

wherein two of the second conductive pads connected to the second wire are located on the same side of each of the first wires;

wherein an orthographic projection of each of the driver chips on the substrate comprises a first parallel edge and a second parallel edge that are parallel to an extension direction of each of the first wires, and the first parallel edge are opposite to the second parallel edge;

the first wire connected to the first type first conductive pad and the first wire connected to the second type first conductive pad serve as a GND transmission line and a transmission line for transmitting voltages required for working of the driver chips, respectively;

in each of the first bonding regions, the first type first conductive pad and the second type first conductive pad are disposed along the first parallel edge; and the first wire connected to the first type first conductive pad and the first wire connected to the second type first conductive pad are located on two opposite sides of the first parallel edge, respectively.

2. The backlight module as claimed in claim 1, wherein at most two of the first conductive pads are disposed along the first parallel edge, and/or, at most two of the first conductive pads are disposed along the second parallel edge.

3. The backlight module as claimed in claim 1, wherein the substrate further comprises second bonding regions, the backlight module further comprises:

at least one third conductive pad disposed in each of the first bonding regions of the substrate, wherein the at least one third conductive pad is connected to a corresponding one of the driver chips;

a light emitting unit disposed in each of the second bonding regions of the substrate; and third wires, wherein an end of each third wire of the third wires is connected to the third conductive pad provided in a corresponding one of the first bonding regions, and another end of the third wire is connected to an end of the light emitting unit provided in a corresponding one of the second bonding regions, such that the third wire transmits a signal in a corresponding one of the driver chips to the light emitting unit, and the third wire extends from a position on which the third conductive pad is located to a side of the second parallel edge away from the first parallel edge;

wherein each of the first wires is located on a side of the second parallel edge near the first parallel edge, and in each of the first bonding regions, the at least one third conductive pad is disposed on a side of each of the first wires near the second parallel edge.

4. The backlight module as claimed in claim 3, wherein in each of the first bonding regions, at least one of the second conductive pads connected to the second wire and at most one of the first conductive pad are disposed along the second parallel edge; and/or, in each of the first bonding regions, at least one of the second conductive pads connected to the second wire and at most two of the first conductive pads are disposed along the first parallel edge;

wherein at most two of the first conductive pads disposed along the first parallel edge are located on a side of at least one of the second conductive pads disposed along the first parallel edge or the second parallel edge away from the second wire connected to the second conductive pads, at most one of the first conductive pad disposed along the second parallel edge is located on a side of at least one of the second conductive pads disposed along the first parallel edge or the second parallel edge away from the second wire connected to the second conductive pads.

5. The backlight module as claimed in claim 1, wherein in each of the first bonding regions, the at least two second conductive pads are disposed along the first parallel edge, the first type first conductive pad and the second type first conductive pad are disposed between adjacent two of the second conductive pads.

6. The backlight module as claimed in claim 1, wherein in each of the first bonding regions, the at least two second conductive pads are disposed along the second parallel edge.

7. The backlight module as claimed in claim 6, wherein one of the at least two second conductive pads is connected to a light emitting unit through a third wire, such that the third wire transmits a signal in a corresponding one of the driver chips to the light emitting unit.

8. The backlight module as claimed in claim 1, wherein the orthographic projection of each of the driver chips on the substrate further comprises a first perpendicular edge and a second perpendicular edge that opposite to each other, the first perpendicular edge is perpendicular to the first parallel edge, and the second perpendicular edge is perpendicular to the first parallel edge; and in each of the first bonding regions, two of the second conductive pads connected to the second wire are disposed along the first perpendicular edge and the second perpendicular edge respectively.

9. The backlight module as claimed in claim 3, wherein in each of the first bonding regions, the at least one third conductive pad is disposed along the second parallel edge.

10. The backlight module as claimed in claim 3, wherein the at least one third conductive pad is disposed along the first parallel edge, the first conductive pad disposed in each of the first bonding regions is one, and the first conductive pad is disposed along the first parallel edge.

11. The backlight module as claimed in claim 3, wherein the orthographic projection of each of the driver chips on the substrate further comprises a first perpendicular edge and a second perpendicular edge that opposite to each other, the first perpendicular edge is perpendicular to the first parallel edge, and the second perpendicular edge is perpendicular to the first parallel edge; and in each of the first bonding regions, the at least one third conductive pad is disposed along at least one of the first perpendicular edge and the second perpendicular edge, and/or, the at least one first conductive pad is disposed along at least one of the first perpendicular edge and the second perpendicular edge.

12. The backlight module as claimed in claim 3, wherein each of the driver chips comprises first pins each connected correspondingly to one of the first conductive pads, second pins each connected correspondingly to one of the second conductive pads, and a third pin connected to the third conductive pad;

another end of the light emitting unit is connected to a fourth wire;

the first conductive pads, the first wires, the second conductive pads, the second wire, the third conductive pad, and the third wires are in the same metal layer.

13. A display panel, wherein the display panel comprises the backlight module as claimed in claim 1.

14. An array substrate, wherein the array substrate comprises the backlight module as claimed in claim 1.

15. A backlight module, wherein the backlight module comprises:

a substrate comprising at least two first bonding regions;

at least one first conductive pad in each of the first bonding regions of the substrate;

at least two second conductive pads disposed in each of the first bonding regions of the substrate;

at least one third conductive pad disposed in each of the first bonding regions of the substrate, wherein the at least one third conductive pad is provided independently of the first conductive pad and the second conductive pads;

a first wire disposed on the substrate and connected to the first conductive pad in each of the first bonding regions;

a second wire disposed on the substrate and connected to two of the second conductive pads located in two of the first bonding regions respectively;

driver chips each connected to the first conductive pad, the second conductive pads, and the third conductive pad in one of the first bonding regions;

a light emitting unit disposed in each of second bonding regions on the substrate; and third wires, wherein an end of each third wire of the third wires is connected to the third conductive pad provided in a corresponding one of the first bonding regions, and another end of the third wire is connected to an end of the light emitting unit provided in a corresponding one of the second bonding regions, such that the third wire transmits a signal in a corresponding one of the driver chips to the light emitting unit;

wherein two of the second conductive pads connected to the second wire are located on the same side of each of the first wires.

16. The backlight module as claimed in claim 15, wherein the driver chips are disposed in each of the first bonding regions respectively, an orthographic projection of each of the driver chips on the substrate comprises a first parallel edge and a second parallel edge that are parallel to an extension direction of each of the first wires, and the first parallel edge are opposite to the second parallel edge;

the at least one first conductive pad in each of the first bonding regions is connected to at least one of the first wires respectively;

wherein at most two of the first conductive pads are disposed along the first parallel edge, and/or, at most two of the first conductive pads are disposed along the second parallel edge.

17. The backlight module as claimed in claim 16, wherein the third wire extends from a position on which the third conductive pad is located to a side of the second parallel edge away from the first parallel edge;

wherein each of the first wires is located on a side of the second parallel edge near the first parallel edge, and in each of the first bonding regions, the at least one third conductive pad is disposed on a side of each of the first wires near the second parallel edge.

18. The backlight module as claimed in claim 16, wherein the orthographic projection of each of the driver chips on the substrate further comprises a first perpendicular edge and a second perpendicular edge that opposite to each other, the first perpendicular edge is perpendicular to the first parallel edge, and the second perpendicular edge is perpendicular to the first parallel edge; and in each of the first bonding regions, the at least one third conductive pad is disposed along at least one of the first perpendicular edge and the second perpendicular edge, and/or, the at least one first conductive pad is disposed along at least one of the first perpendicular edge and the second perpendicular edge.

19. A backlight module, wherein the backlight module comprises:

a substrate comprising at least two first bonding regions;

first conductive pads in each of the first bonding regions of the substrate, wherein the first conductive pads provided in each of the first bonding regions comprise a first type first conductive pad and a second type first conductive pad;

at least two second conductive pads disposed in each of the first bonding regions of the substrate;

first wires disposed on the substrate, wherein the first type first conductive pad provided in each of the first bonding regions is connected to one first wire of the first wires, and the second type first conductive pad provided in each of the first bonding regions is connected to another first wire of the first wires;

a second wire disposed on the substrate and connected to two of the second conductive pads located in two of the first bonding regions respectively; and driver chips disposed in the first bonding regions in one-to-one correspondence, wherein each of the driver chips is connected to the first conductive pads and the second conductive pads provided in a corresponding one of the first bonding regions;

wherein two of the second conductive pads connected to the second wire are located on the same side of each of the first wires;

wherein an orthographic projection of each of the driver chips on the substrate comprises a first parallel edge and a second parallel edge that are parallel to an extension direction of each of the first wires, and the first parallel edge are opposite to the second parallel edge;

wherein the first wire connected to the first type first conductive pad and the first wire connected to the second type first conductive pad serve as a GND transmission line and a transmission line for transmitting voltages required for working of the driver chips, respectively;

wherein in each of the first bonding regions, the first type first conductive pad is disposed along the first parallel edge, and the second type first conductive pad is disposed along the second parallel edge; and wherein the first wire connected to the first type first conductive pad is located on a side of the first parallel edge away from the second parallel edge, the first wire connected to the second type first conductive pad is located between the first parallel edge and the second parallel edge; or the first wire connected to the first type first conductive pad and the first wire connected to the second type first conductive pad are located between the first parallel edge and the second parallel edge, the first wire connected to the first type first conductive pad is located near the first parallel edge, and the first wire connected to the second type first conductive pad is located near the second parallel edge.

20. The backlight module as claimed in claim 19, wherein the first conductive pads in each of the first bonding regions further comprise a third type first conductive pad configured to transmit a signal different from signals transmitted by the first type first conductive pad and the second type first conductive pad, and the third type first conductive pad is disposed along the first parallel edge;

in each of the first bonding regions, the at least two second conductive pads are disposed along the second parallel edge, and the at least two second conductive pads disposed along the second parallel edge are located on two opposite sides of the second type first conductive pad respectively.

* * * * *